United States Patent [19]

Gelsomini et al.

[11] Patent Number: 4,893,280

[45] Date of Patent: Jan. 9, 1990

[54] DUAL PORT RANDOM ACCESS MEMORY HAVING VARIABLY CUSTOMIZED ORGANIZATION OF MEMORY BIT UNITS

[75] Inventors: Tito Gelsomini, Rieti; Pasqualino Fiorentino, Rome, both of Italy

[73] Assignee: Texas Instruments Incorporated, Dallas, Tex.

[21] Appl. No.: 148,457

[22] Filed: Jan. 26, 1988

[30] Foreign Application Priority Data

Feb. 27, 1987 [IT] Italy .............................. 47682 A/87

[51] Int. Cl.$^4$ ........................ G11C 8/00; G11C 7/00; G06F 7/50; G06F 11/00
[52] U.S. Cl. ........................ 365/230.05; 365/189.08; 365/189.06; 307/471; 371/11.1
[58] Field of Search ............... 365/231, 189, 230, 200, 365/230.05, 189.03, 189.06, 189.08; 364/200, 900; 371/11; 307/471

[56] References Cited

U.S. PATENT DOCUMENTS 4,541,076  9/1985  Bowers et al. ...................... 365/190
4,706,216 10/1987  Carter .................................... 365/94

Primary Examiner—Stuart N. Hecker
Assistant Examiner—Melissa J. Koval
Attorney, Agent, or Firm—William E. Hiller; N. Rhys Merrett; Melvin Sharp

[57] ABSTRACT

A dual port random access memory assembly having a custom tailored variable organization comprising a memory array or core (matrix) having, besides a pin for the supply voltage (VDD) connection and a pin for the ground voltage (GND) connection, a first and a second port, each port having two pins for supplying the control signals enabling the read and write operations, respectively; a set of pins for application of the address signals and a set of n data input/output (I/O) pins; wherein an organizer circuit is interposed between the n data input/output pins of the port which is to be organized or formatted and the memory array, which organizer circuit is driven by a number m of signals derived from a corresponding number m of data input/output pins of the output port and applied thereto through a corresponding number m of electronic switches and a corresponding number m of sharper circuits, so as to enable variable sets of bits to access to the memory through selective selts of input terminals and to convert up to a corresponding number m of data input/output pins of the port to be organized into a corresponding number m of additional address pins with respect to the latter port; the electronic switches being driven by a separate control signal.

8 Claims, 2 Drawing Sheets

DUAL PORT RANDOM ACCESS MEMORY HAVING VARIABLY CUSTOMIZED ORGANIZATION OF MEMORY BIT UNITS

This invention relates to a random access memory (RAM) access to which is possible by means of two separate wire bundles or busses, through two separate ports and, in particular, it concerns a memory assembly of the above set forth kind which is adapted to be interfaced to the various users accessing to it with a programmable organization conforming to the particular organization of the user accessing to it and adapted to make a complete utilization of the whole capacity of memory possible.

RAM memories are already known, access to which is possible by means of two separate busses through two separate ports, thus enabling two or more utilizers or users, such as computers, CPU units and/or peripheral units to access to the same memory locations. This occurs by means of two separate busses, each of which bears addresses, data and control signals, access to memory being controlled by a specialized logic built-in device that operates as arbitrator to solve any access conflicts.

These memories are effectively utilized as buffer or transitory memories among various user units accessing to it in a completely asynchronous and independent order and have the function of preventing the untimely and therefore destructive and interferent transfer of data from a unit to the other ones. Thanks to these memories, one or more units interfaced to the two ports can write data into the memory and the same units or other user units can read the necessary data just when such data are needed.

The main drawback of these memories is the rigidity of their organization. It is to be noted, in fact, that if a unit operating on a basis of 8-bit words, such as a microprocessor or a CPU unit, is interfaced to a port, the organization of the memory should necessarily be a $\times 8$ organization, even if a unit operating on a basis of 1-bit words, namely a unit having a $\times 1$ organization such as a serial port, is interfaced to the other port.

A memory of this kind entails the consequence that, in the above mentioned example, each time the $\times 1$ unit writes a bit of data into the memory, such bit occupies only one eighth of a word that is compatible with the $\times 8$ unit. This means that when a $\times 1$ unit has to supply meaningful data to a $\times 8$ unit through a dual port RAM memory, it should necessarily occupy eight 8-bit words of the memory, by introducing one only bit per each word thereinto; the $\times 8$ unit, in turn, should necessarily read all of the eight words, then it should reject the seven meaningless bits therefrom and take only the meaningful single one and lastly it should combine the eight meaningful bits to achieve a meaningful 8-bit word.

All the above outlined steps, besides causing time and software complications to execute the requested actions, entails a tremendous waste of memory space which remains uselessly and fruitlessly engaged.

The main object of this invention is to eliminate this drawback and to provide a memory assembly having in addition to the existing features also the feature of an organization that is programmable and therefore adapted to the particular organizations of the users, thereby providing a variable completely exploiting the memory space.

An immediate result of the above is that the best and most effective application of said programmable organization memory assembly is to be noted when users having different bus structures are to be interfaced to a dual port memory.

As a matter of fact, for instance, an 8K (8192-bit) memory could independently be configured—in respect of each of the two ports—with the requested organization for interfacing to peripheral or CPU units having different organizations. In this example, the memory can be organized as a $512 \times 16$, or $1K \times 8$, or $2K \times 4$, or $4K \times 2$ or, lastly, $8K \times 1$ memory.

Typical applications of this memory assembly are as an interface member between two CPU units having different bus structures, or between a CPU unit and an input/output (I/O) bus. In this case, one of the two ports is connected to the CPU unit, and the other one is connected to the I/O bus to which different peripheral units are connected each of which utilizes a number of address or data bits reflecting its own organization.

When a SRAM memory assembly according to this invention is being used it is possible to configure the memory into a $\times 1$ organization whenever a serial peripheral unit is accessing to it, and when a CPU unit is accessing to it for read and write operations the organization of the memory is modified in accordance with the organization of the CPU unit that can operate on a $\times 4$, $\times 8$, $\times 16$ or $\times 32$ basis, etc.

The same port that in the above set forth example was used in a $\times 1$ organization can be used in subsequent times, in the same system, by some other peripheral unit having an organization other than $\times 1$, by modifying its internal organization via software and by built-in hardware so as to completely exploit all available room in the memory.

This result is achieved, in the scope of this invention, by a memory assembly with programmable organization in one or both ports, comprising a memory array or core (matrix) having, besides a pin for the supply voltage (VDD) connection and a pin for the ground voltage (GND) connection, a first and second port, each port having two pins for coupling the control signals enabling the read and write operations, respectively; a set of pins for application of the address signals and a set of n data input/output (I/O) pins; where an organizer circuit is interposed between the n data input/output pins of the port which is to be organized and the memory array, which organizer circuit is driven by a number m of signals derived from a corresponding number m of data input/output pins of the other port and applied thereto through a corresponding number m of electronic switches and a corresponding number m of shaper circuits, so as to enable variable sets of bits to access to the memory through selective sets of input terminals and to convert up to a corresponding number m of data input/output pins of the port to be organized into a corresponding number m of additional address pins with respect to the latter port; the electronic switches being driven by a separate control signal.

The relationship between numbers n and m is as follows: $m = \log_2 n$ and the "sets" of bits or terminals should be considered as defined by the powers of 2, namely sets of 1, 2, 4, 8 or 16 etc. bits or terminals.

The electronic switches are MOS transistors, so-called transfer transistors.

The shaper circuits may be bistable circuits (flip-flops), static memory cells or the like, which are able to be driven into a stable binary logic status and to maintain it until they receive a further drive signal.

The organizer circuit includes n inputs and n outputs, with n being the number of data input/output pins of the port to be organized; m pairs of two-input NOR gate circuits, each followed by an inverter circuit, wherein the first inputs of the NOR gate circuits of each pair are connected together and directly receive the output signals of m shaper circuits and wherein the second inputs of the NOR gate circuits of each pair have an inverter circuit interposed therebetween and are connected to m input/output pins adapted to selectively operate as data input/output pins or as address pins; and wherein, according to the following order:

the first NOR gate circuit with its associated inverter circuit of the first one of the m pairs drives electronic switches inserted into the lines of a first one-half portion of the n input/output pins; the second NOR gate circuit with its associated inverter circuit of the first pair drives electronic switches inserted into the lines of the second one-half portion of the n input/output pins; the output signal of the first one of the m shaper circuits drives through an inverter circuit electronic switches inserted between the lines of each pin of the first one-half portion and the lines of each pin of the second one-half portion and directly drives electronic switches inserted into the lines of the pins of the second one-half portion of the n input/output pins;

the first NOR gate circuit with its associated inverter circuit of the second one of the m pairs drives electronic switches inserted into the lines of a first one-quarter portion of the n input/output pins; the second NOR gate circuit with its associated inverter circuit of the second pair drives electronic switches inserted into the lines of the second one-quarter portion of the n input/output pins, the output signal of the second one of the m shaper circuits drives through an inverter circuit electronic switches inserted between the lines of each pin of the first one-quarter portion and the lines of each pin of the second one-quarter portion and directly drives electronic switches inserted into the lines of the pins of the second one-quarter portion of the n input/output pins; and the first NOR gate circuit with its associated inverter circuit of the third one of the m pairs drives electronic switches inserted into the lines of a first one-eighth portion of the n input/ouput pins; the second NOR gate circuit with its associated inverter circuit of the third pair drives electronic switches inserted into the lines of the second one-eighth portion of the n input/output pins; the output signal of the third one of the m shaper circuits drives through an inverter circuit electronic switches inserted between the lines of each pin of the first one-eighth portion and the lines of each pin of the second one-eighth portion and directly drives electronic switches inserted into the lines of the pins of the second one-eighth portion of the n input/output pins; and so on.

Further particulars and advantages of this invention will be evident from the following description by referring to the annexed drawings wherein the preferred embodiment is shown by way of illustration and not of limitation.

Figure 1:
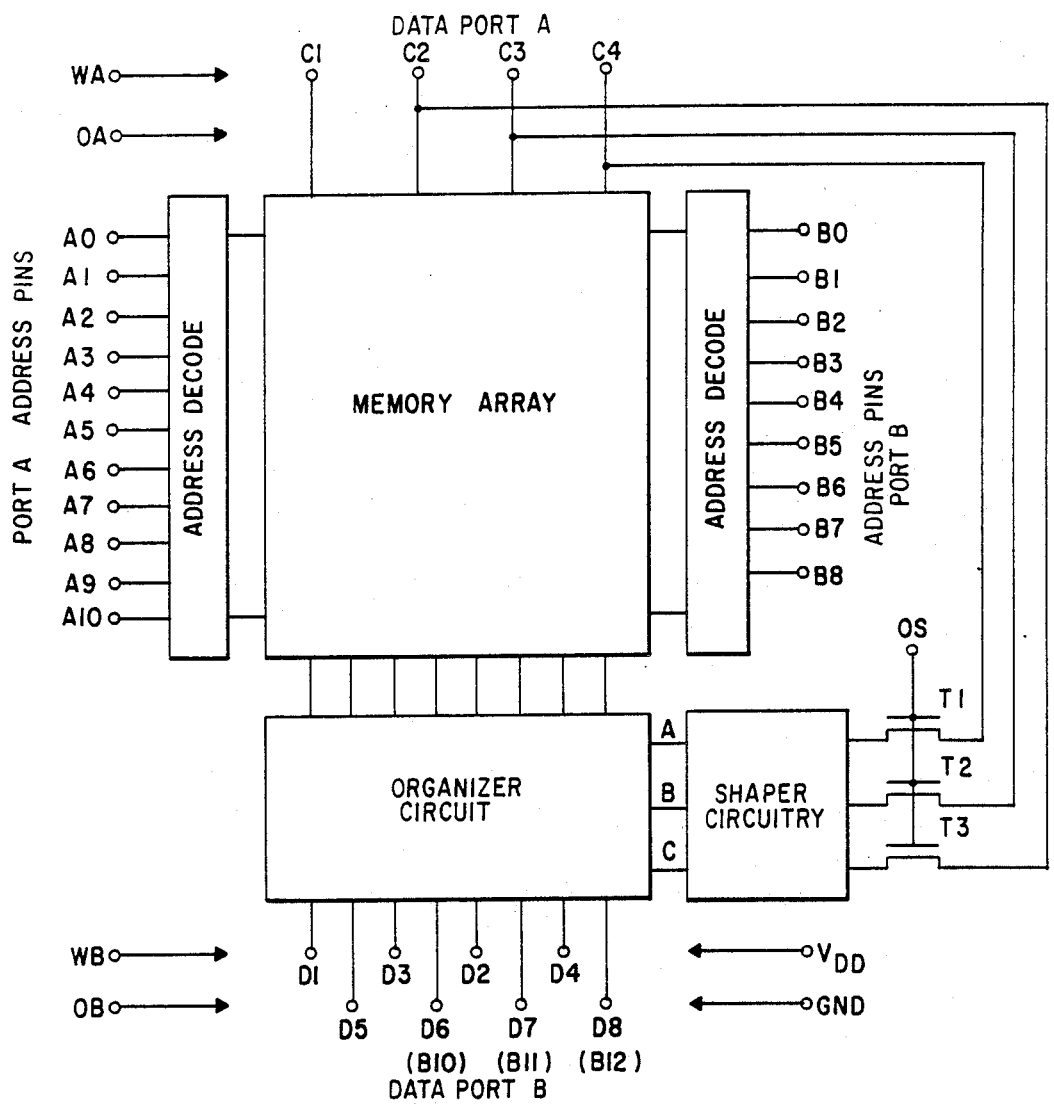
FIG. 1 shows a block diagram of a dual port memory assembly with programmable organization.

By referring to the drawings, it is preliminarily desired to underline that the description will be developed based upon the example of a SRAM memory in N-MOS technology, but this selection should have no restrictive character, either as concerns the memory type, or its dimensions, or the structure of its two ports, and it is aimed at enabling those skilled in the art to design different memory assemblies, operating on the same principles.

In this example, the memory is a SRAM memory having 8192 cells with dual ports A and B. For the sake of simplicity, port A has been designed as a port having a not-organizable rigid structure and it is connected to a bus by means of four data input/output (I/O) pins C1, C2, C3, C4 and eleven address pins A0 to A10. Port B has an organizable structure and is connected to a bus by means of eight data input/output pins D1 to D8 and ten address pins B0 to B9. The term "organizable" when related to port B means that port B can take up any organization pattern ×8 or ×4 or ×2 or ×1; in the example under consideration, some data input/output pins can be operated to address pins depending on the selected organization pattern. As a matter of fact, there will be 10 address pins in the ×8 organization pattern; 11 address pins in the ×4 organization pattern because pin D6 will be operated as an additional address pin B10; 12 address pins in the ×2 organization pattern because pins D6 and D7 will be operated as additional address pins B10 and B11; 13 address pins in the ×1 organization pattern because pins D6, D7 and D8 will be operated as additional address pins B10, B11 and B12, respectively.

Before examining the details of the circuit, it will be appreciated that the number of pins to be converted from input/output pins to address pins depends on the total number of input/output pins of the port it is desired to be made programmable or organizable. In the selected example, port B comprising 8 input/output pins has a number of convertible pins equal to the number of the possible organization patterns the port can take up in addition to the standard ×8 organization pattern, namely the ×4, ×2 and ×1 organization patterns, which means that the number of convertible pins is 3. If the concerned port includes 16 input/output pins, the number of convertible pins and consequently the number of additional address pins should be 4 and so on.

The memory assembly which is being described has two pins for coupling the supply voltage VDD and the ground or null voltage GND thereto, in usual manner.

Conventional pins for application of control signals to enable the write or read operations are provided, namely pins WA and OA for port A and pins WB and OB for port B. A pin OS for organization pattern selecting purposes is provided to apply a control signal to program the port B organization pattern, as will be seen hereinafter.

Control signals WA, OA, WB, OB and OS determine the operation mode of the memory assembly according to the following Table 1, wherein, for the sake of convenience, it is assumed that logically high signals are considered as active signals.

TABLE 1

| Control Signals | | | | | Operation mode | |
| --- | --- | --- | --- | --- | --- | --- |
| WA | OA | WB | OB | OS | PORT A | Port B |
| L | H | L | L | L | read | high impedance |
| H | H | L | L | L | write | high impedance |
| L | L | L | H | L | high impedence | read |

TABLE 1-continued

| Control Signals | | | | | Operation mode | |
|---|---|---|---|---|---|---|
| WA | OA | WB | OB | OS | PORT A | Port B |
| L | L | H | H | L | high impedance | write |
| L | L | L | L | H | high impedance | high impedance (organization selection) |

L = Low logic signal
H = High logic signal.

Aiming at explaining the operation mode when an organization selection is to be made, reference is made to the drawings and it is observed that an "organizer" block is interposed between terminals D1 to D8 and the memory array, said organizer block being driven by three signals A, B and C coming from a shaper block. The shaper block, in turn, receiving three input signals coming from three input/output pins C2, C3, C4 of port A that, in this example, is the not-organizable port.

The lines bearing the signals coming from pins C2, C3, C4 include three electronic switches, made by MOS transistors, so-called transfer transistors, T1, T2, T3, respectively. Transfer transistors T1, T2, T3 are driven by a control signal applied to control pin OS which is connected to their control gate regions, in per se known manner.

Shaper block includes three independent circuits adapted to provide—as output signals—a signal 0 or a signal 1 (under which designations, it is intended in the case under examination to refer to a zero voltage or to a positive voltage, generally 5 V, respectively) and further adapted to maintain such signal until they receive a changement command. Such circuits, therefore, can be made by bistable circuits or by static memory cells or the like, and are controlled by signals applied to pins C2, C3, C4 and transmitted through transfer transistors T1, T2 and T3 and provide stable signals A, B and C which can take up a 0 or a 1 level.

When it is observed that the operation mode for any organization selection needs both ports A and B to be in a high impedance condition, as it results from Table 1, it can be appreciated that, in this operation mode, when signal OS is high transfer transistors T1, T2 and T3 are on and this enables the organizer block to be driven by applying suitable signals to the shaper block through pins C2, C3, C4. In all other operation modes, signal OS is low and transfer transistors T1, T2 and T3 are off, thereby interrupting the connection lines between shaper block and pins C2, C3 and C4. As above said, the values of signals A, B and C of said shaper block are maintained until they are changed through transfer transistors T1, T2 and T3 and pins C2, C3 and C4.

Figure 2:
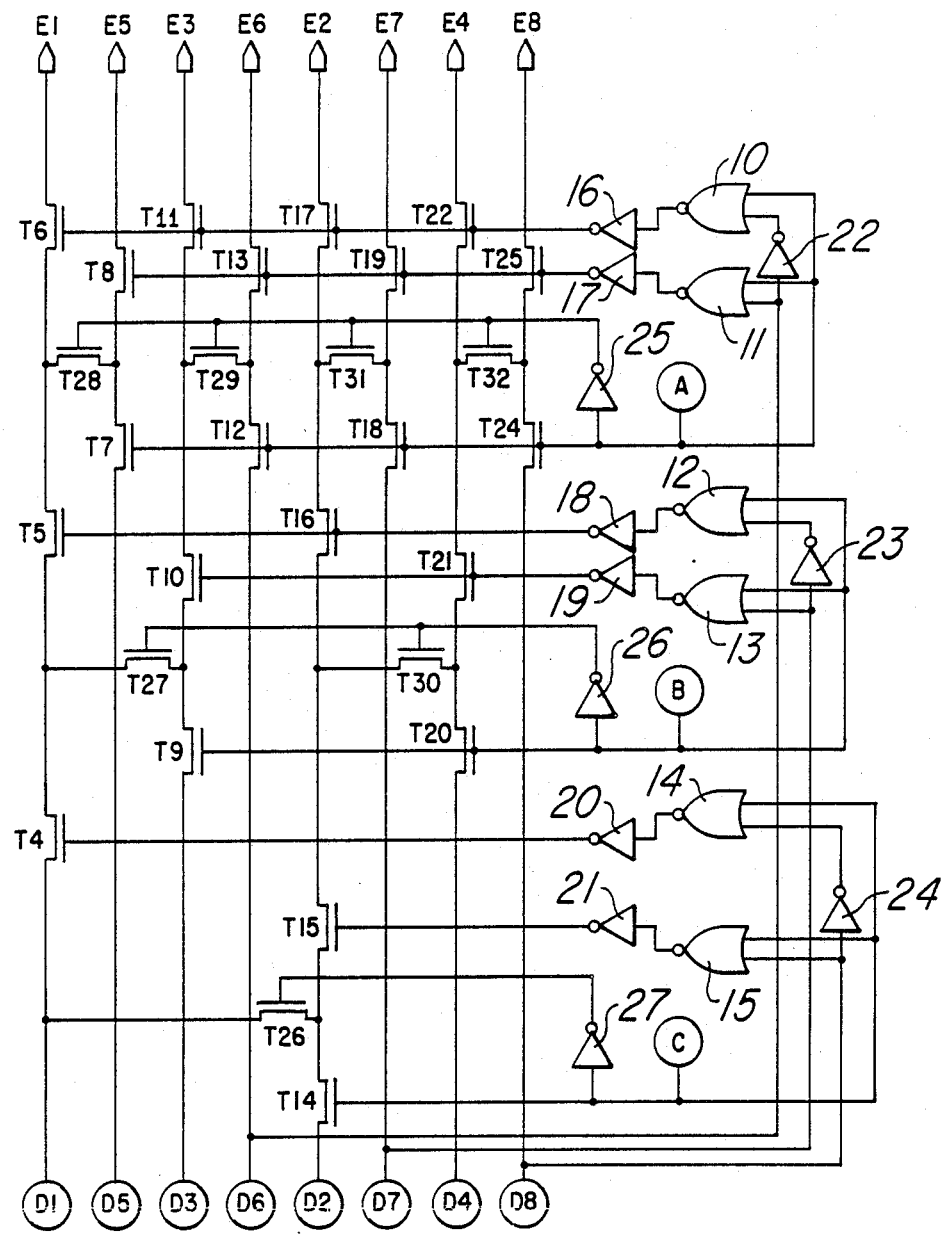
FIG. 2 shows a circuit diagram of the organizer block of FIG. 1.

The details of the organizer circuit appear in FIG. 2. First of all, it is to be noted that the position order of pins D1 to D8 has been modified only for convenience of graphical rapresentation; then it can be observed that the circuit includes three pairs of two-input NOR gate circuits 10, 11; 12, 13; 14, 15, each of these NOR gate circuits being followed by an inverter circuit 16,17,18,19,20,21. The first inputs of the two NOR gate circuits of each pair are connected together and are driven by signals A, B and C, respectively, derived from the related shaper circuits of the shaper block. A respective inverter circuit 22,23 and 24 is inserted between the second inputs of the NOR gate circuits of each pair. Not-inverted inputs, namely the second inputs, of NOR gate circuits 11, 13 and 15 are respectively connected to three input/output pins, namely pins D6,D7 and D8.

Three transfer transistors T4, T5, T6 are inserted in the line of pin D1; two transfer transistors T7, T8 are inserted in the line of pin D5; three transfer transistors T9, T10 and T11 are inserted in the line of pin D3; two transfer transistors T12 and T13 are inserted in the line of pin D6; four transfer transistors T14, T15, T16, T17 are inserted in the line of pin D2; two transfer transistors T18 and T19 are inserted in the line of pin D17; three transfer transistors T20, T21, T22 are inserted in the line of pin D4; two transfer transistors T24 and T25 are inserted in the line of pin D8.

A transfer transistor T26 is connected between pin D1 and an intermediate point between transfer transistors T14 and T15 inserted in the line of pin D2.

A transfer transistor T27 is connected between an intermediate point between transfer transistors T4 and T5 inserted in the line of pin D1 and an intermediate point between transfer transistors T9 and T10 inserted in the line of pin D3. A transfer transistor T30 is connected between an intermediate point between transfer transistors T15 and T16 inserted in the line of pin D2 and an intermediate point between transfer transistors T20 and T21 inserted in the line of pin D4.

A transfer transistor T28 is connected between an intermediate point between transfer transistors T5 and T6 inserted in the line of pin D1 and an intermediate point between transfer transistors T7 and T8 inserted in the line of pin D5. A transfer transistor T29 is connected between an intermediate point between transfer transistors T10 and T11 inserted in the line of pin D3 and an intermediate point between transfer transistors T12 and T13 inserted in the line of pin D6. A transfer transistor T31 is connected between an intermediate point between transfer transistors T16 and T17 inserted in the line of pin D2 and an intermediate point between transfer transistors T18 and T19 inserted in the line of pin D7. A transfer transistor T32 is connected between an intermediate point between transfer transistors T21 and T22 inserted in the line of pin D4 and an intermediate point between transfer transistors T24 and T25 inserted in the line of pin D8.

Transfer transistors T6, T11, T17 and T22 are driven by the ouput of inverter circuit 16. Transfer transistors T8, T13, T19 and T25 are driven by the output of inverter circuit 17. Transfer transistors T7, T12, T18 and T24 are directly driven by signal A derived from the shaper block. Transfer transistors T28, T29, T31 and T32 are driven by inverted signal A, derived from inverter circuit 25.

Transfer transistors T5 and T16 are driven by the output of inverter circuit 18. Transfer transistors T10 and T21 are driven by the output of inverter circuit 19. Transfer transistors T9 and T20 are directly driven by signal B derived from the shaper block. Transfer transistors T27 and T30 are driven by inverted signal B, derived from inverter circuit 26.

Transfer transistor T4 is driven by the output of inverter circuit 20. Transfer transistor T15 is driven by the output of inverter circuit 21. Transfer transistor T14 is directly driven by signal C coming from the shaper block. Transistor T26 is driven by inverted signal C derived from inverter circuit 27.

As a matter of fact, the above described circuitry acts as a specialized exchange or switching station which selectively opens the connections between the input/output pins D1 to D8 and the inputs themselves E1 to E8 of the memory array by means of signals A, B and C. It will be observed that only one case, a direct connection will exist between pins D1 to D8 and the terminals E1 to E8, namely when the ×8 organization pattern is selected. In all remaining cases, some of the D1 to D8 pins will be unused as data input/output pins and therefore they can and will be used as additional address pins. In the selected example, such pins are pins D6, D7 and D8 which drive directly and through inverter circuits 22, 23 and 24 the second inputs of the NOR gate circuits of the already described gate circuit pairs.

The operation should now be evident to those skilled in the art. When, for instance, it is assumed that signal A is a logic signal 1, it can be seen that transfer transistors T7, T12, T18 and T2 are all on; due to the presence of inverter circuit 25, transfer transistors T28, T29, T31 and T32 are all off; due to the presence of a logic signal 1 upon one of the two inputs of both NOR gate circuits 10 and 11, a logic signal 0 will be present upon their outputs and, therefore, a logic signal 1 will be present upon the outputs of both inverter circuits 16 and 17, whereby transfer transistors T6, T11, T17 and T12 as well as transfer transistors T8, T13, T19 and T25 are on.

When signals A, B and C have a logic value 0, then a logic signal 0 is coupled to the first inputs of the NOR gate circuits and the output values of such NOR gate circuits will depend on the signals coupled to their second inputs through pins D6, D7 and D8 directly (as far as NOR gate circuits 11, 13 and 15 are concerned) or through inverter circuits 22, 23 and 24 (as far as NOR gate circuits 10, 12 and 14 are concerned).

When the operation examination is extended to the whole circuitry, the following summarizing table can be set up:

TABLE 2

| Shaper Block output | | | Port B Organization | Valid data Port B | Valid Address Port B |
|---|---|---|---|---|---|
| A | B | C | | | |
| 1 | 1 | 1 | ×8 | D1 to D8 | B0 to B9 |
| 0 | 1 | 1 | ×4 | D1 to D4 | B0 to B10 |
| 0 | 0 | 1 | ×2 | D1,D2 | B0 to B11 |
| 0 | 0 | 0 | ×1 | D1 | B0 to B12 |

In other words, a dual A and B port memory assembly is obtained that can be organized in four different patterns in respect of Port B: 1st pattern, ×8: 8-bit words (D1 to D8) can be applied through port B, by using ten standard addresses (B0 to B9) to reach the memory through terminals E1 to E8;

2nd pattern, ×4: 4-bit words (D1 to D4) can be applied through port B, by using ten standard addresses (B0 to B9) plus an additional address B10 through pin D6 to selectively reach the memory through terminal groups E1 to E4 or E5 to E8;

3rd pattern, ×2: 2-bit words (D1, D2) can be applied through port B, by using ten standard addresses (B0 to B9) plus two additonal addresses B10 and B11 through pins D6 and D7, to selectively reach the memory through terminal groups E1, E2 or E3, E4 or E5, E6 or E7, E8;

4th pattern, ×1: 1-bit words (D1) can be applied to port B, by using ten standard addesses (B0 to B9) plus three additional addresses B10, B11, B12 through pins D6, D7, D8, to selectively reach the memory through any of terminals E1 to E8.

It results from the above that the words that are being written in or read from the memory through port B are comprised of variable bit groups, namely 8 or 4 or 2 or 1 bits, and the terminals through which the memory is accessed to are combined in selective groups, that is to say that they can be selected by means of additional addresses.

As above mentioned, the shaper block includes circuits (bistables, static cells, etc.) adapted to be in a 1 or 0 status under a suitable control signal and to maintain such status until a further suitable control signal is applied thereto. It should be understood that, if circuits or components are used that change their status when a power supply failure occurs, then means should be provided for a failure-safe power supply.

As above already mentioned, a memory array having the following pin definition has been selected by way of description.

| Definition | Port A | Common | Port B |
|---|---|---|---|
| Addresses | A0 to A10 | — | B0 to B9 |
| Data I/O | C1 to C4 | — | D1 to D8 |
| Organization selection | — | OS | — |
| Write enable | WA | — | WB |
| Read enable | OA | — | OB |
| Power Supply | — | VDD | — |
| Ground | — | GND | — |

This case has been selected only as an example of a standard broadly used memory structure. The same principles apply to any kind of memory, with a greater number of cells and with a greater number of pins, and not only one but both ports can be adapted to be selectively organized.

The preferred embodiment has been described above, but it should be understood that those skilled in the art can make amendments, changes and extensions therein, without departing from the scope and coverage of this invention.

I claim:

1. A dual port random access memory having a variably customized organization of memory bit units, said random access memory comprising:
   a memory array having a plurality of memory cells arranged in a matrix;
   first and second data ports;
   said first data port having a plurality of input/output terminal pins connected to input/output lines coupled to said memory array, said first data port also having a first plurality of address pins coupled to corresponding address lines;
   said second data port having a plurality of input/output terminal pins connected to input/output lines coupled to said memory array, said second data port also having a second plurality of address pins coupled to corresponding address lines;
   at least one of said first and second data ports being organizable to provide for a variable number of operable input/output terminal pins and input/output lines for accommodating sets of data bits of a variable number of bits in length and a variable number of address pins and address lines;
   a first address decoder interposed between said first plurality of address lines and said memory array and respectively coupled thereto;
   a second address decoder interposed between said second plurality of address lines and said memory array and respectively coupled thereto;

said organizable data port including said plurality of address pins providing a set of address pins for application of address signals thereto and n data input/output pins connected to n input/output lines;

memory organizer means interposed between said memory array and said organizable data port, said memory organizer means being connected to said n data input/output pins of said organizable data port via said n input/output lines and to said memory array;

means driving said memory organizer means by a selected number of signals numbering from one up to m number of signals to enable respective sets of bits comprising a variable number of bits for access to said memory array through selected sets of input/output terminal pins of said organizable data port, wherein each set of input/output terminal pins is comprised of a number of terminal pins different from the number of terminal pins in another set; and said n data input/output pins of said organizable data port being convertible up to a corresponding number m thereof to be organized into a corresponding number m of additional address pins with respect to said organizable data port in dependence upon the driving of said memory organizer means by a selected number of signals.

2. A dual port random access memory as set forth in claim 1, wherein said at least one organizable data port is said second data port.

3. A dual port random access memory as set forth in claim 1, wherein the numbers n and m are related in accordance with the following relationship:

$m = \log_2 n$, and the numbers of terminal pins included in respective sets of input/output terminal pins are defined according to the powers of 2.

4. A dual port random access memory having a variably customized organization of memory bit units, said random access memory comprising:

a memory array having a plurality of memory cells arranged in a matrix;

first and second data ports;

said first data port having a plurality of input/output terminal pins connected to input/output lines coupled to said memory array, said first data port also having a first plurality of address pins coupled to corresponding address lines;

said second data port having a plurality of input/output terminal pins connected to input/output lines coupled to said memory array, said second data port also having a second plurality of address pins coupled to corresponding address lines;

at least one of said first and second data ports being organizable to provide for a variable number of operable input/output terminal pins and input/output lines for accommodating sets of data bits of a variable number of bits in length and a variable number of address pins and address lines;

memory organizer means interposed between said memory array and said at least one organizable port and respectively coupled to said memory array and to said plurality of input/output lines of said organizable data port;

shaper circuitry means having a plurality of inputs connected to said plurality of input/output lines of the other of said first and second data ports and having a corresponding plurality of outputs connected to said memory organizer means;

a plurality of switches respectively disposed in said plurality of inputs of said shaper circuitry means for selectively connecting said plurality of input/output lines of said other data port to said plurality of inputs of said shaper circuitry means;

a first address decoder interposed between said first plurality of address lines and said memory array and respectively coupled thereto;

a second address decoder interposed between said second plurality of address lines and said memory array and respectively coupled thereto;

said organizable data port including said plurality of address pins providing a set of address pins for application of address signals thereto and n data input/output pins connected to n input/output lines;

said memory organizer means being connected to said n data input/output pins of said organizable data port via said n input/output lines and to said memory array; 'said memory organizer means being driven by a selected number of signals numbering from one up to m number of signals derived from said plurality of input/output lines of the other data port and applied to said memory organizer means through selectively closed ones of said plurality of switches and a number of said plurality of outputs from said shaper circuitry means corresponding to the number of selectively closed switches to enable respective sets of bits comprising a variable number of bits for access to said memory array through selected sets of input/output terminal pins of said organizable data port, wherein each set of input/output terminal pins is comprised of a number of terminal pins different from the number of terminal pins in another set; and said n data input/output pins of said organizable data port being convertible up to a corresponding number m thereof to be organized into a corresponding number m of additional address pins with respect to said organizable data port in dependence upon the driving of said memory organizer means by a selected number of signals.

5. A dual port random access memory as set forth in claim 4, wherein said at least one organizable data port is said second data port.

6. A dual port random access memory as set forth in claim 4, wherein the numbers n and m are related in accordance with the following relationship:

$m = \log_2 n$, and the number of terminal pins included in respective sets of input/output terminal pins are defined according to the powers of 2.

7. A dual port random access memory as set forth in claim 6, wherein said shaper circuitry means comprises m shaper circuits, and said memory organizer means comprises m pairs of dual-input NOR gate circuits and respective inverter circuits connected to the outputs of each of said dual-input NOR gate circuits;

the first inputs of the NOR gate circuits of each pair being connected together for receiving the output signals of m shaper circuits;

the second inputs of the NOR gate circuits of each pair having an inverter circuit interposed therebetween and being connected to m input/output pins adapted to selectively operate as data input/output pins or as address pins;

the first NOR gate circuit and the inverter circuit connected to the output thereof of the first one of said m pairs of dual-input NOR gate circuits driving said switches inserted into the lines of a first one-half portion of said n input/output pins, the second NOR gate circuit and the inverter circuit connected to the output thereof of the first pair of NOR gate circuits having the switches inserted into the lines of the second one-half portion of said n input/output pins, the output signal of the first one of said m shaper circuits driving through an inverter circuit switches inserted between the lines of each pin of said first one-half portion and the lines of each pin of said second one-half portion and directly driving switches inserted into the lines of the pins of said second one-half portion of said n input/output pins;

the first NOR gate circuit and the inverter circuit connected to the output thereof of the second one of said m pairs of dual-input NOR gate circuits driving said switches inserted into the lines of a first one-quarter portion of said n input/output pins, the second NOR gate circuit and the inverter circuit connected to the output thereof of the second pair of NOR gate circuits driving the switches inserted into the lines of the second one-quarter portion of said n input/output pins, the output signal of the second one of said m shaper circuits driving through an inverter circuit switches inserted between the lines of each pin of said first one-quarter portion and the lines of each pin of said second one-quarter portion and directly driving switches inserted into the lines of the pins of said second one-quarter portion of said n input/output pins; and the first NOR gate circuit and the inverter circuit connected to the output thereof of the third one of said m pairs of dual-input NOR gate circuits having said switches inserted into the lines of a first one-eighth portion of said n input/output pins, the second NOR gate circuit and the inverter circuit connected to the output thereof of the third pair of NOR gate circuits driving the switches inserted into the lines of the second one-eighth portion of said n input/output pins, the output signal of the third one of said m shaper circuits driving through an inverter circuit switches inserted between the lines of each pin of said first one-eighth portion and the lines of each pin of said second one-eighth portion and directly driving switches inserted into the lines of the pins of said second one-eighth portion of said n input/output pins.

8. A dual port random access memory as set forth in claim 7, wherein said switches are MOS transfer transistors.

* * * * *